United States Patent [19]

Nuyen et al.

[11] 4,430,740
[45] Feb. 7, 1984

[54] LONG-WAVELENGTH SEMICONDUCTOR LASER

[75] Inventors: Trong L. Nuyen; Baudouin de Cremoux, both of Paris, France

[73] Assignee: Thomson-CSF, Paris, France

[21] Appl. No.: 326,555

[22] Filed: Dec. 2, 1981

[30] Foreign Application Priority Data

Dec. 5, 1980 [FR] France ............................ 80 25911

[51] Int. Cl.$^3$ .............................................. H01S 3/19
[52] U.S. Cl. ...................................... 372/45; 357/17; 357/61
[58] Field of Search ....................... 372/44, 45, 46, 43; 357/16, 17, 61

[56] References Cited

U.S. PATENT DOCUMENTS 4,207,122  6/1980  Goodman .......................... 148/33.4
4,340,966  7/1982  Akiba et al. ........................... 372/45

FOREIGN PATENT DOCUMENTS 2025123  1/1980  United Kingdom .

OTHER PUBLICATIONS

Casey et al., "III-V Binary and Quaternary Lattice-Matching Systems for Heterostructure Lasers", *Meterostructure Lasers Part B: Materials and Operating Characteristics*, Academic Press, 1978, pp. 32, 33, 45 and 46.
IEEE Journal of Quantum Electronics, vol. QE-13, No. 8, Aug. 1977, New York, L. M. Dolginov et al: "Multicomponent Solid-Solution Semiconductor Lasers", pp. 609-611.
Integrated Optics, Topical Meeting on Integrated Optics, 12-14, Jan. 1976 Optical Society of America, Washington; M. A. Pollack "CW Double Heterostructure LED and Laser Sources for the 1 $\mu$m ... ".

*Primary Examiner*—James W. Davie
*Attorney, Agent, or Firm*—Oblon, Fisher, Spivak, McClelland & Maier

[57] ABSTRACT

A semiconductor laser wherein a wide range of laser emission wavelengths can be obtained by varying the composition of monocrystalline alloys employed as semiconductor material. The semiconductor structure comprises on a monocrystalline indium phosphide substrate of a predetermined conductivity type successive epitaxial layers consisting of a first confinement layer of the same conductivity type, an active layer having the formula $(Ga_xAl_{1-x})_{0.47}In_{0.53}As$ where x is within the range of 0 to 0.27, and a second confinement layer of opposite conductivity type. The confinement layers are composed of either InP or a ternary alloy $Al_{0.47}In_{0.53}As$ or a quaternary alloy $Ga_{x'}Al_{1-x'}As_{y'}Sb_{1-y'}$ where $x'$ and $y'$ are chosen so that the material should have a predetermined crystal lattice and an energy gap of greater width than the substrate material.

4 Claims, 5 Drawing Figures

LONG-WAVELENGTH SEMICONDUCTOR LASER

BACKGROUND OF THE INVENTION

1. Field of the Invention

This invention relates to a type of semiconductor laser which is capable of operating either at a long wavelength or at a number of different wavelengths distributed over a broad range, this result being achieved by making use of monocrystalline layers made of different materials which are all compatible with the crystal lattice of a single compound designated as III-V (namely a compound formed of elements of the third and fifth columns of the Periodic Table). This type of laser is applicable in particular to the field of optical fiber telecommunications.

2. Description of the Prior Art

Optical fibers employed in optical telecommunications have a minimum absorption for wavelengths in the vicinity of 1.3 and 1.6 μm. It is therefore an advantage to use emitters which operate within this range.

Conventional semiconductor lasers utilize heterostructures of semiconductor materials which belong:
either to the ternary system: Ga, Al, As;
or to the quaternary system: Ga, In, As, P.

The materials of the second system alone permit laser emission within the minimum absorption range of optical fibers employed in telecommunications.

The aim of the invention is to meet industrial requirements in the field of optical fibers by providing heterostructure semiconductor lasers having a structure which is different from the conventional heterostructures mentioned in the foregoing and offers certain advantages of an industrial character.

It is recalled that the heterostructure of a semiconductor laser is constituted as follows:
a predetermined monocrystalline substrate;
a sandwich comprising three monocrystalline layers which have the same crystal lattice parameter as the substrate, form at least one semiconductor junction between each other, and also satisfy the following two conditions:
(1) The central layer is formed of a semiconductor chosen so as to ensure that the forbidden band or energy gap corresponds to a predetermined wavelength; this layer forms the active zone;
(2) The outer layers have energy gaps of greater width than that of the central layer in order to create a confinement of the electron carriers in the central layer, hence the name of confinement layers given to these outer layers.

Known forms of construction thus include lasers in which provision is made for an active layer of GaAs on a GaAs substrate and confinement layers of $Al_xGa_{1-x}As$, or lasers in which provision is made for an active layer of $Ga_xIn_{1-x}As$ or $Ga_xIn_{1-x}As_yP_{1-y}$ and confinement layers of InP on an InP substrate.

SUMMARY OF THE INVENTION

In order that the choice of these compositions and consequently the aim of the present invention may be more readily understood, consideration will be given to the diagram (FIG. 1) showing both the values of the forbidden band or energy gap (plotted as ordinates) and the values of the crystal lattice parameter (plotted as abscissae) of the III-V compounds. The binary compounds are therefore represented by points having predetermined coordinates. The ternary alloys are located on lines connecting the points which are representative of the binary compounds. In order not to complicate the diagram unduly, the ternary alloys are not all shown in this figure. The quaternary alloys are located in areas inscribed within closed geometrical figures constituted by the lines which define the ternary alloys. For example, the quaternary alloys containing Ga, Al, In and Sb are represented by the points located within the shaded area "AlSb—GaSb—InSb". It is apparent from this diagram that a laser having an active GaAs layer can have a confinement layer $Al_xGa_{1-x}As$ ($0<x<1$) or $Ga_xIn_{1-x}P_ySb_{1-y}$, and so on. In practice, the confinement layer employed is $Al_xGa_{1-x}As$. Since the width of the energy gap of GaAs is 1.43 eV, the wavelength emitted by the laser is therefore 0.87 μm. Furthermore, should it be desired to have lasers which emit in the vicinity of 1.3 and 1.6 μm, the materials employed for the active layer must have an energy gap width of approximately 0.95 to 0.78 eV. Within this energy range, a number of types of alloys are theoretically suitable: $Ga_xIn_{1-x}As_yP_{1-y}$, $Ga_xAl_{1-x-y}In_yAs$, $Ga_xAl_{1-x-y}As_ySb_{1-y}$ and $Ga_xAl_{1-x-y}In_ySb$ (the indices x, y will be explained below). However, taking into account the fact that the different layers mentioned above must be deposited by epitaxy on a predetermined substrate and that said substrate must have the same crystal lattice parameter as the layers deposited thereon, it is therefore necessary to choose one out of four different types of substrate material: InP, InAs, GaSb, InSb. Of these four types, InP is the most readily available and may therefore be considered as the most suitable in practice. The use of InP as substrate material being consequently postulated, there remain two alternatives for obtaining an active layer having an energy gap in the vicinity of 0.95 to 0.78 eV, namely $Ga_xIn_{1-x}As_yP_{1-y}$ and $Ga_xAl_{1-x-y}In_yAs$.

Lasers having an active layer consisting of $Ga_xIn_{1-x}As_yP_{1-y}$ have already been produced. They have a confinement layer InP, the energy gap of which is 1.36 eV. This choice results, however, in a number of limitations:

1—The energy gap of InP is not of sufficient width to produce an appreciable confinement action.

2—The alloy $Ga_xIn_{1-x}As_yP_{1-y}$ cannot readily be produced in accordance with certain epitaxial growth techniques such as molecular beam epitaxy by reason of the volatile character of phosphorus.

The aim of the present invention is to overcome these limitations by using for the active layer a quaternary material containing three group III elements and one group V element.

The laser according to the invention is of the type comprising a monocrystalline substrate of InP of a predetermined conductivity type, and at least the following epitaxial layers: a first confinement layer of the same conductivity type as the substrate, an active layer and a second confinement layer of opposite conductivity type, the confinement layers being constituted by semiconductor materials having a composition such that their energy gap is of greater width than that of the material constituting the active layer, the crystal lattice parameters of all the semiconductor materials being equal to those of the substrate to within 1%.

The laser is distinguished by the fact that the material constituting the active layer corresponds to the general formula:

$(Ga_xAl_{1-x})_{0.47}In_{0.53}As$ with: $0 < x < 0.27$.

BRIEF DESCRIPTION OF THE DRAWINGS

These and other features of the invention will be more apparent upon consideration of the following description and accompanying drawings, wherein.

DESCRIPTION OF THE PREFERRED EMBODIMENT

Figure 1:
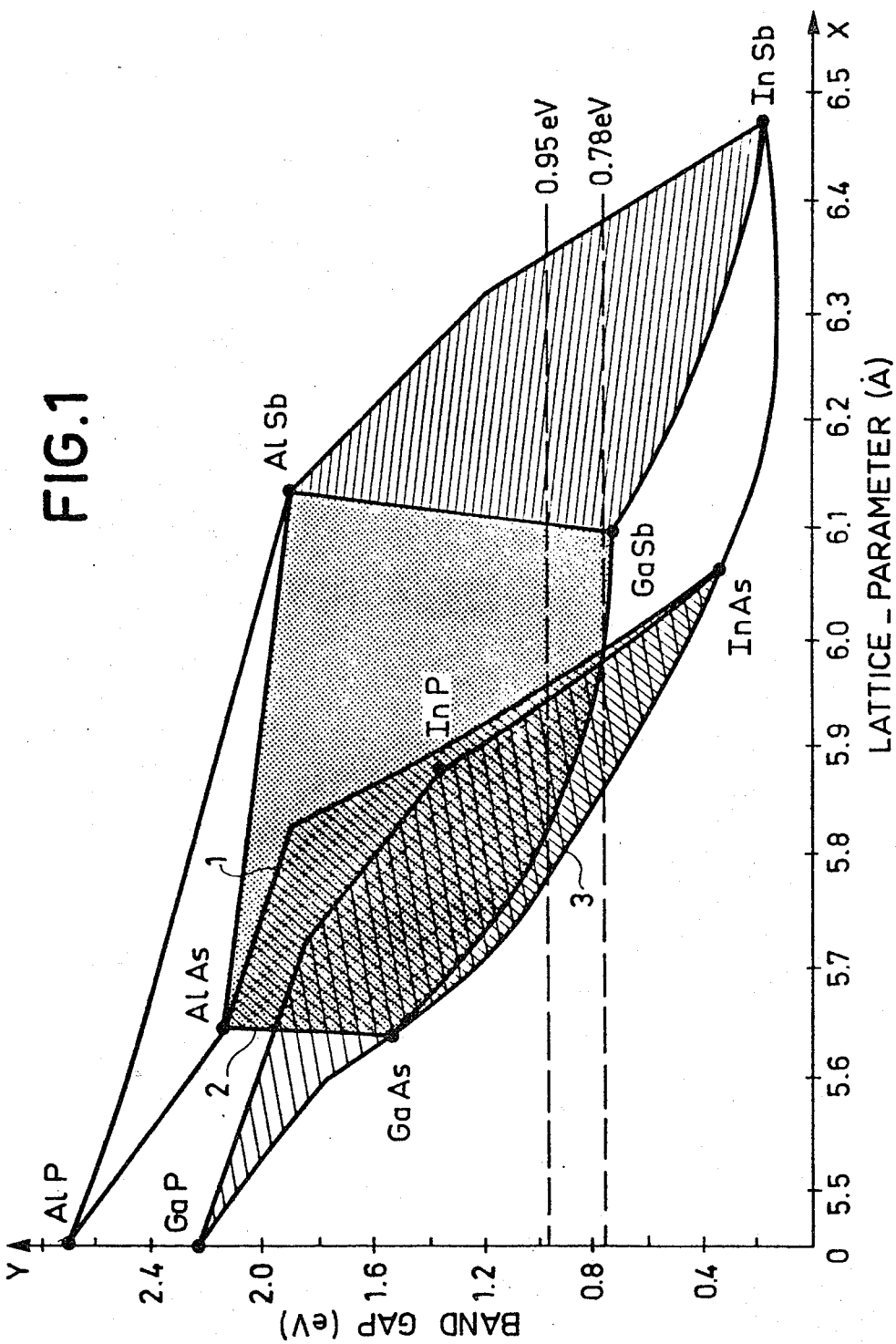
FIGS. 1 and 2 are explanatory diagrams.

The materials of the active layer, in the case of the invention, are quaternary alloys (Ga, Al, In, As). As shown in the diagram of FIG. 1 (already discussed in the foregoing), the representative points of said alloys are located within the shaded area of oblong shape delimited by:
- a broken line 1 which joins the representative points of the compounds AlAs and InAs;
- the line segment 2 which joins the representative points of the compounds AlAs and GaAs; these compounds have substantially the same crystal lattice parameter;
- the curvilinear segment which joins the representative points of the compounds GaAs and InAs.

It is apparent from the diagram that the area thus defined contains the representative point of the compound InP.

The foregoing observation constitutes the essential conceptual basis of the invention.

In fact, the alloy to be chosen for the formation of the active layer of the laser is the quaternary alloy (Ga, Al, In, As), the representative point of which is located on a line parallel to the axis Oy which passes through the point InP, namely:

$(Ga_xAl_{1-x})_{0.47}In_{0.53}As.$

The energy gap or forbidden bandwidth of this alloy is within the range of 0.75 eV in respect of $x=1$ to 1.47 eV in respect of $x=0$. A linear relation exists between the two parameters.

In regard to the confinement layers, a number of different solutions are adopted while remaining within the scope of the invention: a binary, ternary or quaternary alloy having the same crystal lattice parameter as the compound InP. The alloy can be InP itself. In order to ensure effective performance of the confinement function, however, it also remains necessary to satisfy the additional condition mentioned above, namely that the energy gap of the confinement layer is of greater width than that of the alloy which forms the active layer. The representative point of the material constituting the confinement layer must therefore be located above the representative point of InP.

Figure 2:
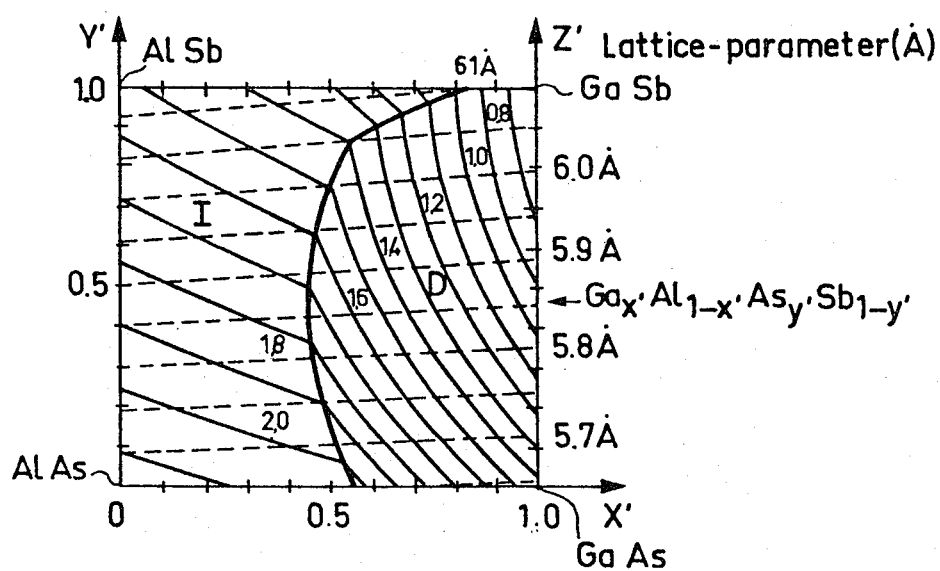

If a quaternary alloy having the following composition is chosen:

$Ga_{x'}Al_{1-x'}As_{y'}Sb_{1-y'}$ the diagram of FIG. 2 is employed to determine the values of x' and y'. This diagram has an axis of abscissae $Ox'$ which expresses the concentration of Ga as a fraction of 0 to 1, and two axes of ordinates:

$OY'$: concentration of As;

$OZ'$: pseudo-axis of the values of the crystal lattice parameter which depends to a very limited extent on the concentration of Ga and to a considerable extent on the concentration of As. The value of the parameter is expressed in Angströms.

The dashed lines correspond to alloys having the same crystal lattice parameter and are substantially parallel to the axis $Ox'$.

The full lines are of two types:
(1) Curves which have a point of inflection and give the alloy composition of equal energy gap width expressed in electron-volts.
(2) A curve which joins the points of inflection of the lines mentioned above and divides the diagram into two domains:
   D: alloy in which the direct energy gap is utilized;
   I: alloy in which the indirect energy gap is utilized.

The values of x' and y' of the composition chosen for the purpose of constituting the confinement bands of the laser are the coordinates of the point of intersection of a dashed line (or parallel line, by interpolation) and a line graduated in energy gap or forbidden band widths.

Figure 3:
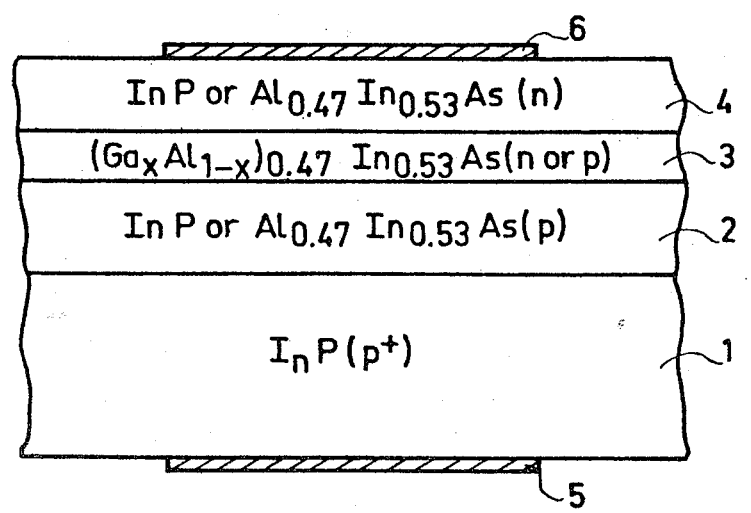
FIGS. 3 to 5 are diagrammatic sectional views of semiconductor lasers according to the invention.
Figure 4:
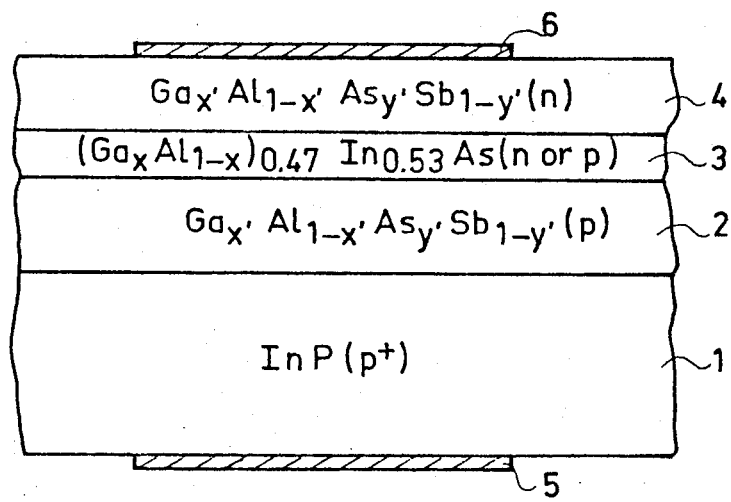
Figure 5:
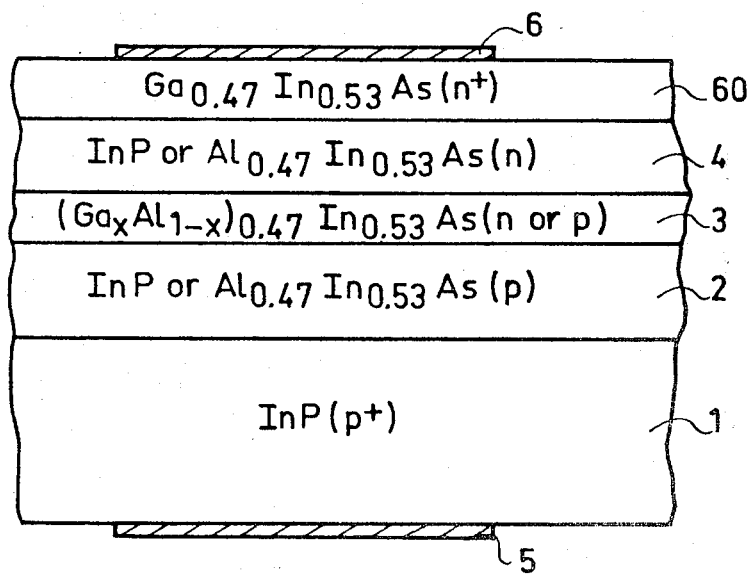

FIGS. 3 to 5 are fragmentary diagrammatic cross-sections of a laser substrate 1 which supports a confinement layer 2, an active layer 3, another confinement layer 4 and an additional layer if so required (designated by the reference 60 in FIG. 4) and, finally, metallization deposits 5 and 6 which form ohmic contacts with the material of the end faces. These metallization layers are intended to provide a good connection with a voltage source.

The examples of construction of the invention as thus illustrated all have a $p^+$ doped InP substrate. An $n^+$ doped substrate is also possible and corresponds to another series of examples (not illustrated) in which doping could be of the opposite conductivity type, in which case the voltage supply would have opposite polarities.

In the example of FIG. 3, the characteristics of the layers are as follows:
   Layer 2: p-type doped InP or $Al_{0.47}In_{0.53}As$;
   Layer 3: n-type or p-type doped $(Ga_xAl_{1-x})_{0.47}In_{0.53}As$;
   Layer 4: same composition as the layer 2 and having an n-type dopant concentration.

The value of x is chosen as a function of the emission wavelength or, in practice, as a function of the energy gap width of the material of the active layer, this width being necessarily smaller than that of the layers 2 and 4. We therefore have:

$0.01 < x < 0.27.$

In the example of FIG. 4, the compositions are as follows:
   Layer 2: p-type doped $Ga_{x'}Al_{1-x'}As_{y'}Sb_{1-y'}$;
   Layer 3: same composition and same dopant concentration as in the preceding example;
   Layer 4: same composition as the layer 2 aforesaid and having an n-type dopant concentration.

The parameter x is chosen as in the preceding example.

The parameters x' and y' are chosen as explained in the foregoing in connection with the diagram of FIG. 2 in order to have an energy gap of greater width than that of the active layer.

In the example of FIG. 5, the compositions and dopant concentrations are the same as those of the example of FIG. 3 but there has been deposited on the layer 4 an additional layer 60 having an n+ dopant concentration and the following composition:

$$Ga_{0.47}In_{0.53}As.$$

This additional layer has the intended function of improving the quality of the ohmic contact of the metallization deposit 6.

In a further example (not shown in the drawings) corresponding to FIG. 4, an additional layer has been added as in the case of FIG. 5.

Among the advantages of the invention which have not yet been indicated, it is worthy of note that the laser emission wavelength is defined by the percentage of aluminum with respect to gallium in the active layer. This property is of great value in certain expitaxial growth techniques, especially in the case of molecular beam epitaxy (MBE).

In fact, in the case of molecular beam epitaxy, the value of the parameter x of the composition obtained is given directly by the ratio of gallium and aluminum streams fed into an epitaxial-growth reaction vessel.

What is claimed is:

1. In a semiconductor laser of the type comprises a monocrystalline substrate of InP of a predetermined conductivity type, and at least the following epitaxial layers: a first confinement layer of the same conductivity type of the substrate, an active layer and a second confinement layer of opposite conductivity type, the confinement layers being constituted by materials having an energy gap of greater width than that of the material constituting the active layer, the improvement wherein the material constituting said active layer is an alloy which corresponds to the formula:

$$(Ga_xAl_{1-x})_{0.47}In_{0.53}As$$

with: $0 < x < 0.27$ and wherein the confinement layers are made of an alloy corresponding to the formula $Al_{0.47}In_{0.53}As$.

2. In a laser according to claim 1, the improvement wherein an additional layer is deposited by epitaxial growth on the confinement layer which is remote from the substrate, wherein said additional layer is more heavily doped than said confinement layer and is of the same conductivity type and wherein said additional layer is constituted by an alloy corresponding to the formula:

$$Ga_{0.47}In_{0.53}As.$$

3. In a semiconductor laser of the type comprises a monocrystalline substrate of InP of a predetermined conductivity type, and at least the following epitaxial layers: a first confinement layer of the same conductivity type of the substrate, an active layer and a second confinement layer of opposite conductivity type, the confinement layers being constituted by materials having an energy gap of greater width than that of the material constituting the active layer, the improvement wherein the material constituting said active layer is an alloy which corresponds to the formula:

$$(Ga_xAl_{1-x})_{0.47}In_{0.53}As$$

with: $0 < x < 0.27$ and wherein the confinement layers are made of an alloy corresponding to the formula:

$$Ga_{x'}Al_{1-x'}As_{y'}Sb_{1-y'}$$

in which the parameters x' and y' within the range zero to one are so determined as to ensure that the monocrystalline alloy has a crystal lattice parameter equal to that of the material of the active layer and an energy gap of greater width than that of the active layer.

4. In a laser according to claim 3, the improvement wherein an additional layer is deposited by epitaxial growth on the confinement layer which is remote from the substrate, wherein said additional layer is more heavily doped than said confinement layer and is of the same conductivity type and wherein said additional layer is constituted by an alloy corresponding to the formula:

$$Ga_{0.47}In_{0.53}As.$$

* * * * *